United States Patent
Parks et al.

(10) Patent No.: US 7,126,638 B2
(45) Date of Patent: Oct. 24, 2006

(54) IMAGE SENSOR HAVING MULTIPLE LAYERS OF DIELECTRICS ADJACENT THE PHOTOSENSITIVE AREA FOR IMPROVED QUANTUM EFFICIENCY

(75) Inventors: Christopher Parks, Rochester, NY (US); James P. Lavine, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 978 days.

(21) Appl. No.: 10/142,301

(22) Filed: May 9, 2002

(65) Prior Publication Data

US 2003/0210342 A1 Nov. 13, 2003

(51) Int. Cl.
*H04N 5/225* (2006.01)

(52) U.S. Cl. ............... 348/340; 348/335; 257/436; 250/216

(58) Field of Classification Search ........ 348/335, 348/340; 250/208.1, 216; 257/292, 436; 385/126–127; 438/31
See application file for complete search history.

(56) References Cited

U.S. PATENT DOCUMENTS

| 6,259,083 | B1 * | 7/2001 | Kimura | 250/208.1 |
|---|---|---|---|---|
| 6,858,828 | B1 * | 2/2005 | Roy et al. | 250/208.1 |
| 6,969,899 | B1 * | 11/2005 | Yaung et al. | 257/436 |
| 2005/0116271 | A1 * | 6/2005 | Kato | 257/292 |
| 2005/0236553 | A1 * | 10/2005 | Noto et al. | 250/208.1 |

FOREIGN PATENT DOCUMENTS

| JP | 61049466 | * | 3/1986 |
|---|---|---|---|
| JP | 10154805 | * | 6/1998 |
| JP | 2001237405 | * | 8/2001 |

* cited by examiner

*Primary Examiner*—Tuan Ho
*Assistant Examiner*—Gary C. Vieaux
(74) *Attorney, Agent, or Firm*—Peyton C. Watkins

(57) ABSTRACT

An image sensor for capturing an image includes a photosensitive area for receiving incident light; a substance placed covering a portion of the photosensitive area which substance includes a first index of refraction; and a plurality of electrodes positioned adjacent the substance having a dielectric placed between a portion of the electrodes, which dielectric includes a second index of refraction lower than the first index of refraction.

12 Claims, 3 Drawing Sheets

IMAGE SENSOR HAVING MULTIPLE LAYERS OF DIELECTRICS ADJACENT THE PHOTOSENSITIVE AREA FOR IMPROVED QUANTUM EFFICIENCY

FIELD OF THE INVENTION

The invention relates generally to the field of image sensors and, more particularly, to such image sensors having a substance with a index of refraction higher than the index of refraction of the surrounding material.

BACKGROUND OF THE INVENTION

Referring to FIG. 1, prior art image sensors 10 include a plurality of electrodes 15 stacked vertically beside a photosensitive area 20, and a transparent dielectric 30 is disposed over the photosensitive area 20 and between the electrodes. A microlens 40 rests on a transparent spacer 50 over the dielectric for focusing the incident light (depicted by the arrows) onto the photosensitive area 20. The majority of the incident light passes through the microlens 40 and overlaying dielectric 30 and onto the photosensitive area 20. Upon passing through the microlens 40 and subsequently, a portion of the light, however, is dispersed outwardly. As a consequent, this dispersed light does not reach the photosensitive area 20.

Although the currently known and utilized image sensors and method for making such image sensors are satisfactory, they include drawbacks. As mentioned above, a portion of the light passes between the electrodes and is not directed toward the photosensitive area 20, and as a result, there is an inherent inefficiency resulting from this mis-directed light.

Consequently, a need exists for an image sensor and a method for making such image sensors in which this inefficiency is eliminated

SUMMARY OF THE INVENTION

The present invention is directed to overcoming one or more of the problems set forth above. Briefly summarized, according to one aspect of the present invention, the invention resides in an image sensor for capturing an image comprising: (a) a photosensitive area for receiving incident light; (b) a substance covering a portion of the photosensitive area which substance includes a first index of refraction; and (c) a dielectric positioned adjacent the substance having a second index of refraction lower than the first index of refraction for assisting in directing a substantial portion of the incident light to photosensitive area.

These and other aspects, objects, features and advantages of the present invention will be more clearly understood and appreciated from a review of the following detailed description of the preferred embodiments and appended claims, and by reference to the accompanying drawings.

Advantageous Effect of the Invention

The present invention has the advantage of providing an image sensor in which the light is substantially passed to the photosensitive area.

DETAILED DESCRIPTION OF THE INVENTION

Figure 1:
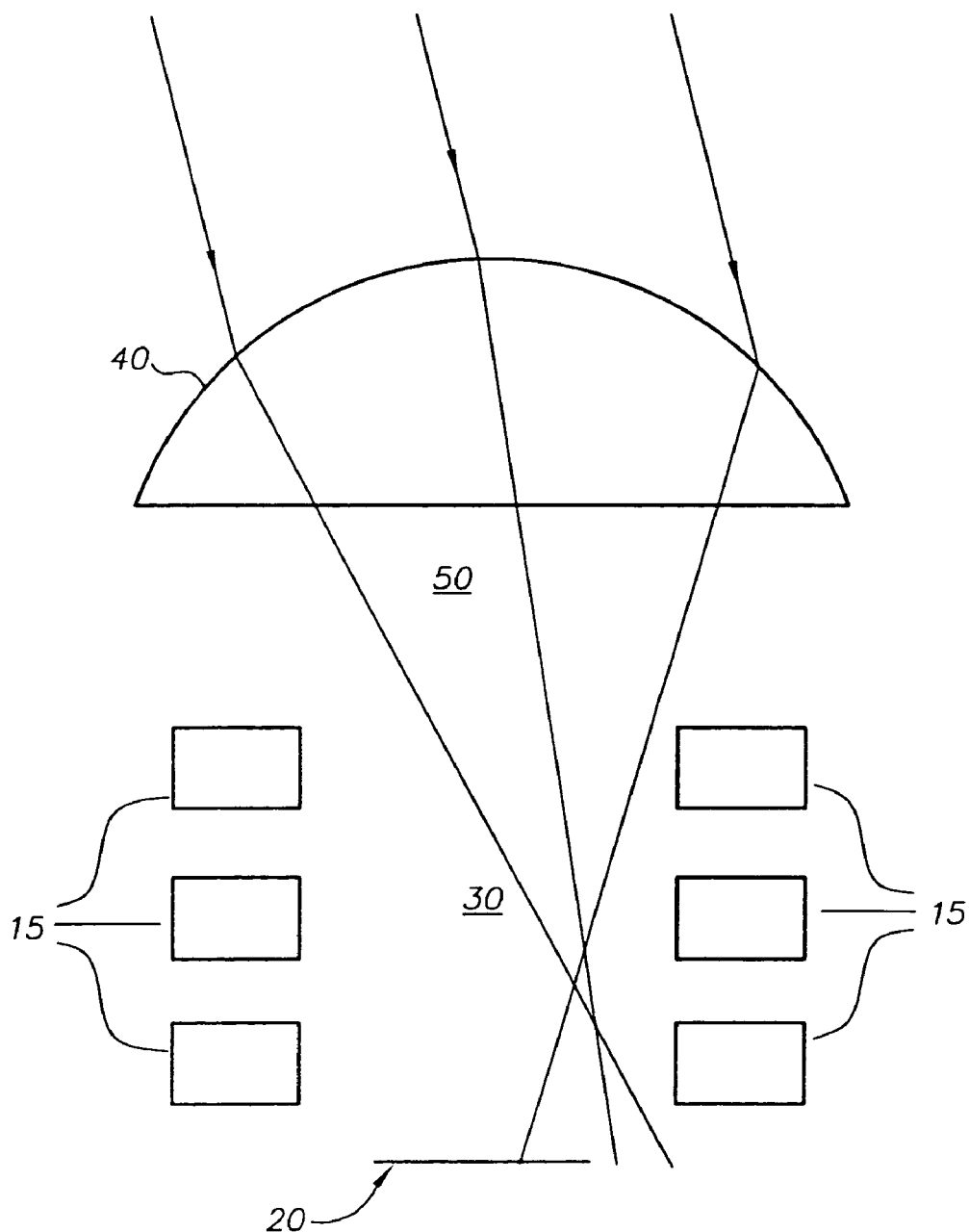
FIG. 1 is a drawing of a prior art sensor illustrating the inefficient loss of light that does not reach the photodetector.

In the drawings, several components, such as the spacer and dielectrics, are transparent and are better illustrated with only a numeral indicating its general location. Other transparent components, such as the microlens, are better illustrated with some sort of illustrated marking and the numeral.

Figure 2:
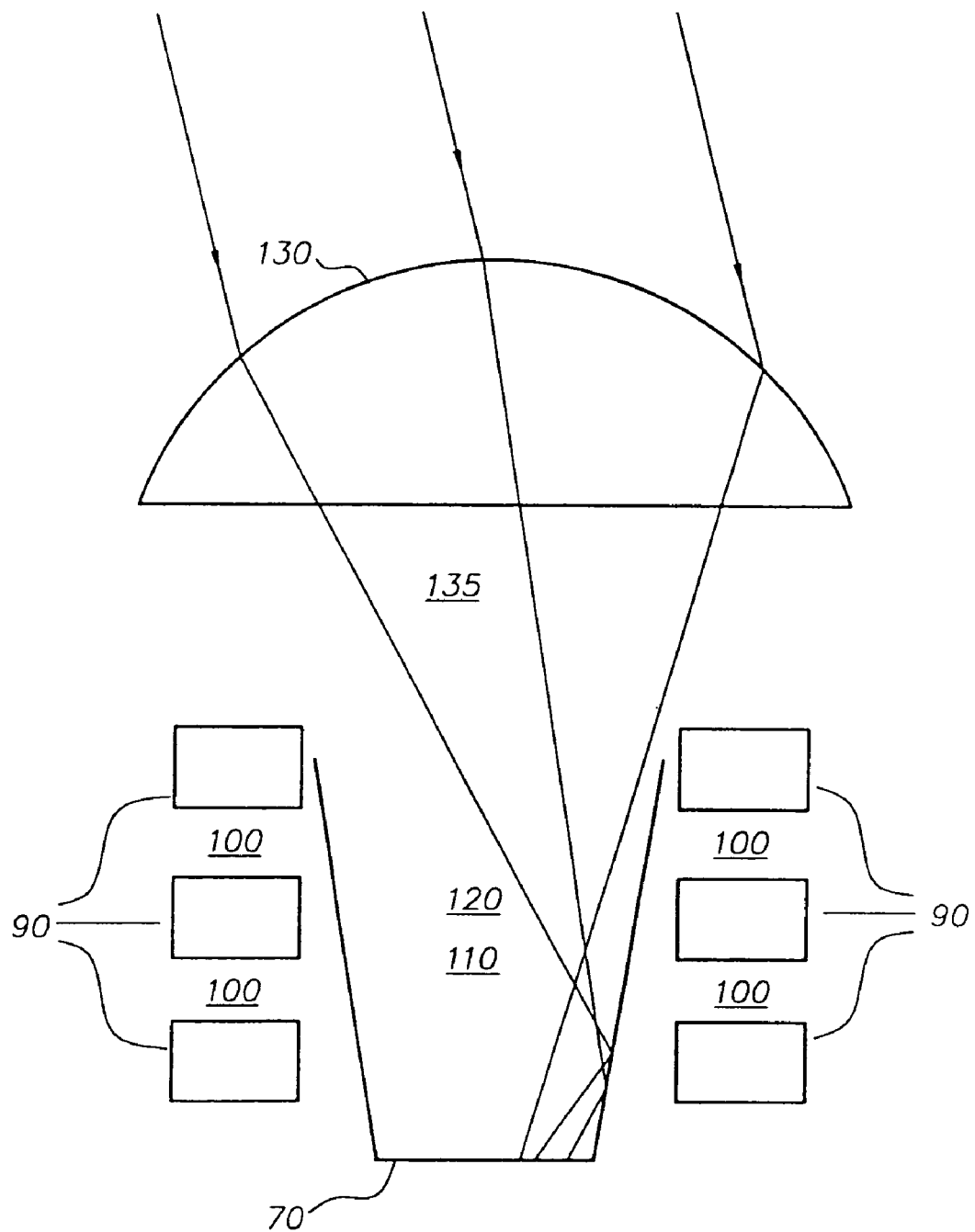
FIG. 2 is a drawing of the image sensor of the present invention illustrating the improved efficiency of light reaching the photodetector.

Referring to FIG. 2, an image sensor 60 of the present invention is shown. The sensor 60 includes a photodiode 70 disposed in a substrate for collecting the incident light (depicted by the arrows). A plurality of electrodes 90 are stacked in a vertical spaced-apart relationship adjacent and slightly to the side of the photodiode 70 so that they do not directly cover the photodiode 70. A first dielectric 100, preferably silicon dioxide, is disposed between the electrodes 90 so that it also does not directly cover the photodiode 70. In manufacturing such an image sensor 60, in practice, a portion 110 directly covering the photodiode 70 may temporarily be covered with the first dielectric 100 along with the above mentioned areas, and the portion 110 directly covering the photodiode is then to be etched away for later filling, as described hereinbelow.

The portion 110 directly above the photodiode 70 is filled with a second dielectric 120, preferably silicon nitride, and a microlens 130 is placed on a spacer 135 and over the second dielectric 120 for focusing light into the portion 110.

It is to be noted that silicon nitride has an index of refraction which is higher than the index of refraction of the silicon dioxide. This significantly enhances the amount of the incoming incident light that stays within the second dielectric 120 so that it does not escape into the first dielectric 100. This obviously increases the efficiency of the image sensor.

As is obvious to those skilled in the art, the image sensor 60 of the present invention includes a plurality of photodiodes 70 having the above-described components for increasing the efficiency, although only one is shown for simplicity and clarity of understanding.

Figure 3:
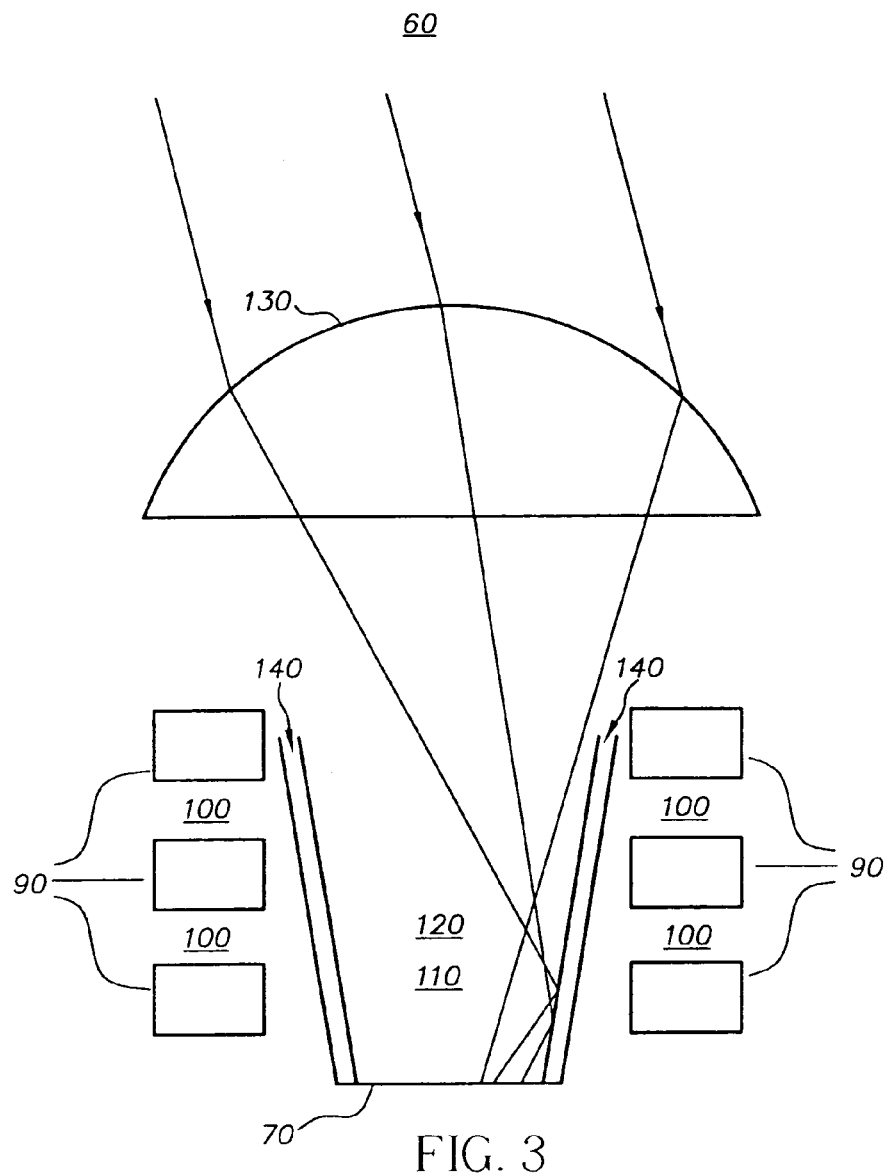
FIG. 3 is an alternative embodiment of FIG. 2.

Referring to FIG. 3, an alternative embodiment of the present invention is shown. In this embodiment, after the first dielectric 100 is etched away form the area directly over the photodiode 70, as described above, an additional thin layer of dielectric 140 is deposited on the sidewall. The second dielectric 120 is deposited so as to fill the remaining etched away portion 110 inside the first dielectric 100. This permits a wider choice of the first dielectric material.

Figure 4:
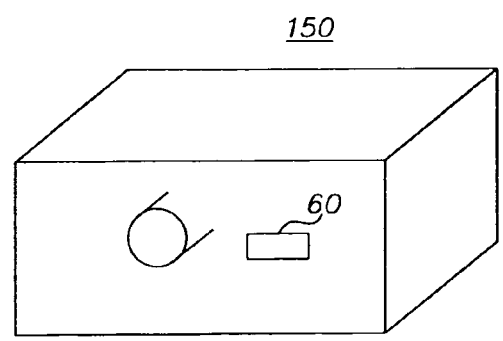
FIG. 4 is a perspective view of a digital camera having the image sensor of the present invention.

Referring to FIG. 4, there is shown a digital camera 150 in which the sensor 60 may be inserted for creating a commercially, ordinary-consumer, usable embodiment of the present invention.

The invention has been described with reference to a preferred embodiment. However, it will be appreciated that variations and modifications can be effected by a person of ordinary skill in the art without departing from the scope of the invention.

Parts List

| | |
|---|---|
| 10 | image sensor |
| 15 | electrodes |

-continued

| | |
|---|---|
| 20 | photosensitive area |
| 30 | dielectric |
| 40 | microlens |
| 50 | spacer |
| 60 | image sensor |
| 70 | photodiode |
| 90 | electrodes |
| 100 | first dielectric |
| 110 | portion |
| 120 | second dielectric |
| 130 | microlens |
| 135 | spacer |
| 140 | thin layer of dielectric |
| 150 | digital camera |

The invention claimed is:

1. An image sensor for capturing an image comprising:
   (a) a photosensitive area for receiving incident light;
   (b) a second dielectric covering a portion of the photosensitive area which substance includes a second index of refraction;
   (c) at least one first dielectric positioned adjacent the substance having a first index of refraction lower than the second index of refraction for assisting in directing a substantial portion of the incident light to the photosensitive area; and
   (d) a layer of a third dielectric with a lower index of refraction than the second dielectric positioned between the first and second dielectrics.

2. The image sensor as in claim 1, wherein the second dielectric is silicon nitride.

3. The image sensor as in claim 2, wherein the first dielectric is silicon dioxide.

4. The image sensor as in claim 1 further comprising a microlens placed covering a portion of the second dielectric for focusing the incident light on the photosensitive area.

5. A method for manufacturing an image sensor, the method comprising the steps of:
   (a) providing a photosensitive area for receiving incident light;
   (b) covering a portion of the photosensitive area with a second dielectric, which includes a second index of refraction;
   (c) providing a first dielectric positioned adjacent the second dielectric having a first index of refraction lower than the second index of refraction for assisting in directing a substantial portion of the incident light to the photosensitive area; and
   (d) providing a layer of a third dielectric with a lower index of refraction than the second dielectric positioned between the first and second dielectric.

6. The method as in claim 5, wherein step (b) includes providing silicon nitride as the second dielectric.

7. The method as in claim 6, wherein step (c) includes providing silicon dioxide as the first dielectric.

8. The method as in claim 5 further comprising the step of placing a microlens covering a portion of the second dielectric for focusing the incident light on the photosensitive area.

9. A digital camera for capturing an image, comprising:
   (a) an image sensor;
   (b) a photosensitive area for receiving incident light;
   (c) a second dielectric covering a portion of the photosensitive area which substance includes a second index of refraction;
   (d) a first dielectric positioned adjacent the substance having a first index of refraction lower than the second index of refraction for assisting in directing a substantial portion of the incident light to the photosensitive area;
   (e) a layer of a third dielectric with a lower index of refraction than the second dielectric positioned between the first and second dielectric.

10. The digital camera as in claim 9, wherein the substance is silicon nitride.

11. The digital camera as in claim 10, wherein the dielectric is silicon dioxide.

12. The digital camera as in claim 9 further comprising a microlens placed covering a portion of the substance for focusing the incident light on the photosensitive area.

* * * * *